(12) United States Patent
Zeng et al.

(10) Patent No.: US 12,312,676 B2
(45) Date of Patent: May 27, 2025

(54) PROCESSING METHOD AND APPARATUS FOR ULTRAFAST LASER DEPOSITION OF MULTILAYER FILM INCLUDING DIAMOND-LIKE CARBON FILM, ANTI-REFLECTION FILM AND ANTI-FINGERPRINT FILM

(71) Applicants: Chongqing Huapu Scientific Instrument Co., Ltd., Chongqing (CN); ROI Optoelectronics Technology CO, LTD., Shanghai (CN); Yunnan Huapu quantum Material Co., Ltd, Yunnan (CN); Chongqing Huapu Quantum Technology Co., Ltd., Chongqing (CN); East China Normal University, Shanghai (CN); Chongqing Institute of East China Normal University, Chongqing (CN)

(72) Inventors: Heping Zeng, Chongqing (CN); Mengyun Hu, Chongqing (CN); Yu Qiao, Chongqing (CN)

(73) Assignees: CHONGQING HUAPU SCIENTIFIC INSTRUMENT CO., LTD., Chongqing (CN); ROI OPTOELECTRONICS TECHNOLOGY CO, LTD., Shanghai (CN); YUNNAN HUAPU QUANTUM MATERIAL CO., LTD, Yunnan (CN); CHONGQING HUAPU QUANTUM TECHNOLOGY CO., LTD., Chongqing (CN); EAST CHINA NORMAL UNIVERSITY, Shanghai (CN); CHONGQING INSTITUTE OF EAST CHINA NORMAL UNIVERSITY, Chongqing (CN)

( * ) Notice: Subject to any disclaimer, the term of this patent is extended or adjusted under 35 U.S.C. 154(b) by 12 days.

(21) Appl. No.: 18/353,684

(22) Filed: Jul. 17, 2023

(65) Prior Publication Data
US 2024/0026524 A1 Jan. 25, 2024

(30) Foreign Application Priority Data
Jul. 19, 2022 (CN) .......................... 202210851038.4

(51) Int. Cl.
*C23C 14/28* (2006.01)
*C03C 17/42* (2006.01)
(Continued)

(52) U.S. Cl.
CPC .............. *C23C 14/28* (2013.01); *C03C 17/42* (2013.01); *C23C 14/021* (2013.01);
(Continued)

(58) Field of Classification Search
None
See application file for complete search history.

(56) References Cited

U.S. PATENT DOCUMENTS

2005/0271349 A1* 12/2005 Obara ................ G02B 6/12002
385/147
2023/0093899 A1* 3/2023 Zeng ..................... G01J 3/1809
356/451

FOREIGN PATENT DOCUMENTS

| CN | 113960015 | | 1/2022 | |
| CN | 113960015 A | * | 1/2022 | ............ G01J 3/1809 |

OTHER PUBLICATIONS

CNIPA, Office Action issued in Chinese Patent Application No. 202210851038.4, Nov. 21, 2023.

* cited by examiner

*Primary Examiner* — Michael P. Rodriguez
(74) *Attorney, Agent, or Firm* — Hodgson Russ LLP

(57) ABSTRACT

A processing method and apparatus for ultrafast laser deposition of a multilayer film including a diamond-like carbon (Continued)

film, an anti-reflection film and an anti-fingerprint film includes: generating primary plasma by first excitement on a target material with a femtosecond or picosecond pulsed laser beam as a pre-pulse; and generating secondary plasma by second excitement on the target material under plasma grating, formed by allowing two femtosecond pulsed laser beams to intersect at a small include angle for interaction in the primary plasma, for deposition to coat a film.

7 Claims, 3 Drawing Sheets

(51) Int. Cl.
  *C23C 14/02* (2006.01)
  *C23C 14/06* (2006.01)
  *C23C 14/54* (2006.01)
(52) U.S. Cl.
  CPC ...... *C23C 14/0605* (2013.01); *C23C 14/0652* (2013.01); *C23C 14/542* (2013.01); *C03C 2217/732* (2013.01); *C03C 2217/76* (2013.01); *C03C 2218/151* (2013.01); *C03C 2218/31* (2013.01)

PROCESSING METHOD AND APPARATUS FOR ULTRAFAST LASER DEPOSITION OF MULTILAYER FILM INCLUDING DIAMOND-LIKE CARBON FILM, ANTI-REFLECTION FILM AND ANTI-FINGERPRINT FILM

CROSS-REFERENCE TO RELATED APPLICATIONS

This application claims priority to the Chinese Patent Application No. 202210851038.4, filed on Jul. 19, 2022, the entire disclosure of which is incorporated herein by reference.

FIELD

The disclosure relates to the field of processing a multilayer film, and in particular to a processing method and apparatus for ultrafast laser deposition of a multilayer film including a diamond-like carbon film, an anti-reflection film and an anti-fingerprint film.

BACKGROUND

The diamond-like carbon (DLC) film is an amorphous carbon film formed by sp3, sp2 and a small amount of sp1 hybridized carbon atoms, with characteristics such as high hardness, low friction coefficient, and strong resistance to friction, wear and chemical corrosion, providing a favorable physical protection effect. The DLC film obtained by different film coating processes will exhibit different morphologies, microstructures and stress levels, where a high content of sp3 hybridized carbon atoms contributes to a better performance. The anti-reflection (AR) film can effectively increase the light transmittance of glass, while the anti-fingerprint (AF) film is useful in protection against oil, fouling and fingerprint. These properties are in widespread demand in electronics such as a mobile phone, a tablet and a display, where most scenarios require a screen to be both friction-resistant and anti-fouling. The traditional physical method for coating a film such as low-energy-cluster-beam-deposition, vacuum vapor deposition and physical vapor deposition, as well as the traditional chemical method for coating a film such as sol-gel, chemical vapor deposition and electro-deposition although can achieve the above films, there are disadvantages such as complicated process, high cost, time consuming and the like, and when coating multilayered films, a posterior coating condition may affect the quality of the already coated films. With the development of electronics, there is an increasing need for an optical film and requirements for thickness, uniformity, hardness of the material, wear-resisting performance and service life of the films are also becoming higher.

Pulse Laser Deposition (PLD) is a new physical deposition process that involves exciting a coating material (i.e., a target material) with a pulse laser to generate high-temperature and high-pressure plasma that are sprayed onto a glass (i.e., a substrate) for depositing a film. This technique has advantages such as simple process, high film formation rate and ability to produce a microstructure, making it one of the hot spots of the current research in the field of coating. Despite all the advantages of PLD, there are still a number of technical difficulties that need to be addressed. In terms of many target materials that are difficult to excite by a pulse laser, the film prepared by PLD often contains small molten particles and target material fragments, due to incomplete inter-reaction between the pulse laser and the target material. The presence of some clusters composed of small particles in the excited plasma destroys uniformity of the film. In addition, due to a limited output energy of a laser device, it is difficult for the PLD technique to excite a carbon atom to transition to a higher energy level when processing a film, resulting in a low final content of the sp3 hybridized carbon atoms (sp3C), thereby leading to undesirable optical and mechanical properties of the film. At present, it is still difficult for the PLD technique to coat a film with a spreading area by deposition, and thus the PLD technique has not yet in widespread use in the field of coating a films on the glass substrate commercially.

SUMMARY

The disclosure directs to provide a processing method and apparatus for ultrafast laser deposition of a multilayer film including a diamond-like carbon (DLC) film, an anti-reflection (AR) film and an anti-fingerprint (AF) film, so as to achieve coating the multilayer film with a spreading area by deposition effectively.

In view of the above, the disclosure provides in embodiments a processing apparatus for ultrafast laser deposition of a multilayer film including a diamond-like carbon film, an anti-reflection film and an anti-fingerprint film, wherein the processing apparatus includes a laser emitting unit, a delay unit, a beam-splitting unit, a reflection unit and a loading platform, wherein the laser emitting unit generates a plurality of pulsed laser beams, one of which as a pre-pulse excites a target material to produce plasma, and remainders of which are beam-split as post-pulses by the beam-splitting unit and time domain-synchronized by a delay unit before intersect for interaction to form plasma grating in the plasma for secondary excitement on the target material.

The disclosure further provides in embodiments a processing method for ultrafast laser deposition of a multilayer film including a diamond-like carbon film, an anti-reflection film and an anti-fingerprint film, the processing method includes the following steps:

Step 1: providing a glass substrate;

Step 2: providing carbon as a first target material for the diamond-like carbon film, silicon nitride or single-crystal silicon as a second target material for the anti-reflection film, and perfluoropolyether as a third target material for the anti-fingerprint film;

Step 3: arranging, at the loading platform in a vacuum chamber, the first and second target materials away from the glass substrate at a distance of 2 to 5 cm before vacuuming;

Step 4: coating the diamond-like carbon film, including: generating by a laser emitting unit a plurality of pulsed laser beams, one of which as a pre-pulse excites the first target material to produce primary plasma, and remainders of which are beam-split as post-pulses by the beam-splitting unit and time domain-synchronized by a delay unit to intersect for interaction to form plasma grating in the primary plasma for secondary excitement on the first target material, thereby producing and depositing graphite plasma on the glass substrate, and moving the first target material relative to the glass substrate, thereby forming the diamond-like carbon film with a spreading area; and Step 5: coating the anti-reflection film and the anti-fingerprint film, including:

repeating the Step 4 with the first target material replaced by the second target material, to coat the anti-reflection film on the diamond-like carbon film, and coating the anti-fingerprint film with the third target material by a spraying apparatus.

Embodiments of the disclosure are based on a principle and exhibit an advantage as below. It is necessary for a carbon ion in plasma to acquire enough powerful energy so as to form a sp3 bond of a carbon atom more easily, due to its much higher bond energy than that of a sp2 bond of the carbon atom in practical use, so as to improve performance of the diamond-like carbon film. In the related art, it is difficult for a laser generator (limited by its output energy) to excite the carbon atom to transition to a higher energy level during coating the film, resulting in an insufficient content of a sp3 hybridized carbon atom (sp3C), and thereby leading to undesirable optical and mechanical properties of the film. In view of the above, in embodiments of the disclosure, the target material is excited under the plasma grating (as an exciting source) with an extremely high electron density and optical power density, such that the target material is co-excited with electron collision and multiple photons, avoiding a light filament generated from constraining by power, thus effectively enhancing a kinetic energy of the carbon atom in the graphite plasma, and thereby improving efficiency of forming the diamond-like carbon film. Besides, the high electron density allows a reduced probability of forming small particles in high-temperature and high-pressure plasma, thereby improving quality of the formed film. In addition, a stronger laser exciting efficiency effectively increases the number of atoms and ions at the high energy level in the plasma, thus assisting in forming the film with a nanocrystalline structure and a mesoporous structure.

Furthermore, the target material is excited by the femtosecond pulsed laser beam, with a low heat effect generated by the processing method, thus achieving processing with high precision and microprocessing in a certain scenario. Besides, before exciting the target material, the femtosecond pulsed laser beam passes through the glass substrate at first for a pre-treatment to activate a surface of the glass substrate, on which the deposition of the plasma is more easily for coating the film.

In the embodiments of the disclosure, the plasma grating formed with the femtosecond pulsed laser beam exhibits a longer and stable plasma channel, reducing an adverse influence of surface irregularity of the target material on the exciting efficiency during processing, thus improving uniformity of the coated film.

Further, in the embodiments of the disclosure, the AR film as a transition layer is made of silicon nitride, in which a Si atom is bonded to an oxygen atom in the AF film, forming a Si—O bond, which effectively increases adhesion of the AF film on the DLC film, thereby effectively improving durability of the multilayer film. Besides, the AF film is coated by the spraying apparatus, avoiding the target material from decomposition under a high temperature which causes loss of hydrophobic property of the AF film.

Preferably, as an improvement, the laser emitting unit includes one or more of a femtosecond pulsed laser beam generator and a picosecond pulsed laser beam generator; the delay unit is a time delay generator; the beam-splitting unit is a beam splitter, wherein the beam splitter is arranged opposite to the femtosecond pulse laser generator or the picosecond pulsed laser beam generator; and the reflection unit includes a plurality of reflectors.

In the embodiments of the disclosure, the time delay generator synchronizes the post-pulses, which ensures all the post-pulses, after beam-split by the beam splitter and passing through different reflective and transmissive paths, to have synchronized optical paths, i.e., arriving at the surface of the target material simultaneously to intersect for interaction, thereby forming the plasma grating to excite the target material. The processing apparatus according to embodiments of the disclosure is provided with a well-designed structure, satisfying the requirements of the processing method in embodiments of the disclosure.

Preferably, as an improvement, in the Step 1, providing a glass substrate further includes: washing the glass substrate respectively with an organic solvent and deionized water under sonication for 30 to 50 min; and drying at a temperature of 60 to 80° C. for 1 h.

In the embodiments of the disclosure, the glass substrate is pretreated by washing and drying before coated with the film, thus removing various impurities attached to the surface of the glass substrate, and thereby ensuring the film to be coated on the glass substrate uniformly.

Preferably, as an improvement, in the Step 3, the vacuum chamber is provided with a pressure less than or equal to 10 mBar by the vacuuming.

In the embodiments of the disclosure, the above pressure reflecting a vacuum degree in the vacuum chamber plays a crucial role on uniformity of the coated film, where excessive pressure causes oxygen and nitrogen to react with the high-temperature and high-pressure plasma produced from the target material to form impurities, thereby adversely influencing the uniformity of the coated film. The pressure for vacuuming in embodiments of the disclosure is proven to be superior by experience.

Preferably, as an improvement, in the Step 4, a total laser energy is greater than or equal to 2 mJ; and a single femtosecond pulsed laser beam after the beam-splitting is of an energy greater than 0.5 mJ, a repetition frequency of 1 kHz to 1 MHz, a pulse width of 10 to 500 fs, and a central wavelength of 200 to 400 nm in an ultraviolet band, 400 to 700 nm in a visible band, or 700 to 2500 nm in an infrared band.

In the embodiments of the disclosure, it is necessary for the single femtosecond pulsed laser beam to be of a sufficiently high energy, so as to form the plasma grating exhibiting superiority in coating the film, otherwise the outcome is not desirable under a low energy. The repetition frequency is related to the efficiency of coating the film with the spreading area, where the higher the repetition frequency, the greater the number of pulsed laser beams per unit time, so that faster scanning film-coating is achieved by increasing a speed of moving the target material relative to the glass substrate. The pulse width is also related to forming the plasma grating, where the plasma grating is formed generally depending on the optical power density, which is calculated by dividing the laser energy by the pulse width and further by a spot area, with the higher optical power density contributing to forming the plasma grating. Accordingly, it is necessary to provide a higher laser energy for a pulsed laser beam with a large pulse width, so as to form the plasma grating, and it is also difficult for the pulsed laser beam with the large pulse width to achieve similar film-coating effect by the pulsed laser beam with a narrow pulse width. The central wavelength of the pulsed laser beam is related to a photon energy, where the shorter the central wavelength, the higher the photon energy for stronger ionisation to excite the target material. The single femtosecond pulsed laser beam after output from the femtosecond pulsed laser beam generator and beam-split by the beam spitting unit is of an energy greater than 0.5 mJ, which ensures a femtosecond light filament to be formed. The primary plasma produced by excitement with the pre-pulse on the target material assists in forming the plasma grating with the post-pulses to achieve the secondary excitement on the target material. The secondary excitement under the plasma grating effectively reduces the clusters in the primary plasma produced by the excitement with the pre-pulse on the target material, thereby improving the uniformity of the coated film.

Preferably, as an improvement, in the Step 4, the excitement with the pre-pulse is 100 fs to 100 ns before the secondary excitement with the post-pulses; the pre-pulse is a picosecond pulsed laser beam broadened from a femtosecond pulsed laser beam or generated by a picosecond pulsed laser beam generator; and the post-pulses forms an included angle 5 to 10°.

In the embodiments of the disclosure, the excitement with the pre-pulse is controlled 100 fs to 100 ns before the secondary excitement with the post-pulses, achieving better excitement and improving the uniformity of the coated film. In addition, the post-pulses are arranged to form a small included angle between filaments, so that the multiple femtosecond pulsed laser beams once focused intersect at the small included angle for interaction in an intersecting region, resulting in an interference that creates a periodic intensity distribution. In the intersecting region, a light intensity is further increased due to the Kerr self-focusing effect, the plasma grating is firstly formed here and achieves equilibrium with the Kerr self-focusing effect, thus forming a plasma channel with a spatially periodic distribution. It has been shown that it is difficult to form the plasma grating with an over-large or over-small included angle between the filaments.

Preferably, as an improvement, in the Step 4, the first target material is moved relative to the glass substrate at a speed of 10 to 50 mm/s.

In the embodiments of the disclosure, the speed of moving the first target material relative to the glass substrate plays a crucial role on the film-coating effect and generates a synergistic effect with the parameters of the pulsed laser beam. In a specific example, the first target material is moved relative to the glass substrate at the speed of 20 to 30 mm/s, achieving coating the film with a spreading area and avoiding the target material from forming a micro pit at the same location by excessive excitement. The first target material is moved relative to the glass substrate at different speeds, so as to control a thickness of the coated film with significantly enhanced precision due to multi-point source excitement under the plasma grating.

Preferably, as an improvement, the second target material for the anti-reflection film is silicon nitride.

In the embodiments of the disclosure, an optimal second target material for the anti-reflection film is silicon nitride, which ensures the uniformity and quality of the coated film and allows for convenient operations of coating the film. In other embodiments, the second target material for the anti-reflection film is single-crystal silicon, it is required to excite the single-crystal silicon under a nitrogen atmosphere to form a silicon nitride film. Accordingly, the Si atom in the silicon nitride film formed promotes the adhesion of the AF film on the DLC film, thereby effectively improving the durability of the multilayer film.

Preferably, as an improvement, the disclosure further provides in embodiments a multilayer film including a diamond-like carbon film, an anti-reflection film and an anti-fingerprint film prepared according to the method in any of the above embodiments, wherein the multilayer film exhibits an initial drop angle of 110 to 120 degrees.

In the embodiments of the disclosure, the multilayer film prepared by the processing apparatus and method in any of the above embodiments exhibits the initial drop angle of 110 to 120 degrees, which meets a current industry required strand.

DETAILED DESCRIPTION

Figure 1:
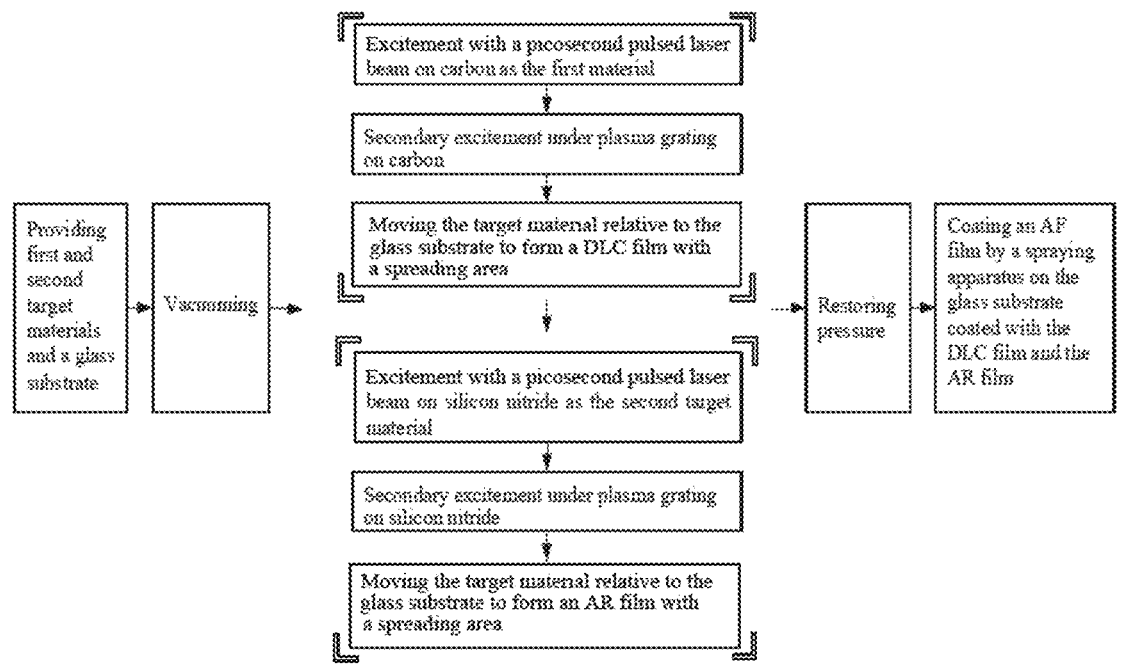
FIG. 1 is a flow chart showing a processing method for ultrafast laser deposition of a multilayer film including a diamond-like carbon film, an anti-reflection film and an anti-fingerprint film on a glass substrate in an embodiment of the disclosure.

The disclosure is further described in details below by specific examples, which should not be construed to limit the disclosure. Unless specifically indicated otherwise, the technical means used in the following examples are conventional means well known to those skilled in the art, the experimental methods used are conventional methods, and the materials, reagents, and the like used are commercially available.

The reference signs in the accompany drawings includes: a femtosecond pulsed laser beam generator 1; a picosecond pulsed laser beam generator 2; a digital time delay generator 3; a beam splitter 4; a high reflection mirror A 5; a high reflection mirror B 6; a high reflection mirror C 7; a high reflection mirror D 8; a stepping motor 9; a high reflection mirror E 10; a focusing lens 11; a high reflection mirror F 12; and a loading platform 13.

Protocols Summary

FIG. 1 is a flow chart showing a processing method for ultrafast laser deposition of a multilayer film including a diamond-like carbon film, an anti-reflection film and an anti-fingerprint film in an embodiment of the disclosure.

As shown in FIG. 1, the processing method for ultrafast laser deposition of the multilayer film including the diamond-like carbon (DLC) film, the anti-reflection film (AR) and the anti-fingerprint (AF) film includes the following steps (1) to (5).

At the step (1), a glass substrate is provided. In specific, the glass substrate to be coated is washed respectively in acetone or alcohol and deionized water under sonication, before fully dried in a drying oven.

At the step (2), high purity carbon as a first target material for the DLC film, silicon nitride as a second target material for the AR film, and perfluoropolyether as a third target material for the AF film are provided.

At the step (3), the first and second target materials are fixed, by a damper at corresponding positions of the loading platform in a vacuum chamber, away from the glass substrate at a distance of 3 to 5 cm. Subsequently, the vacuum chamber is vacuumed to achieve a pressure less than or equal to 10 mBar.

At the step (4), the DLC film is coated. In specific, the first target material is firstly excited with a picosecond pulsed laser beam, with primary plasma produced; and after a time interval, two femtosecond pulsed laser beams intersect noncollinearly within the primary plasma to form plasma grating for secondary excitation on the first target material, with more plasma produced, which is deposited onto the glass substrate under cooling, thereby forming the DLC film.

At the step (5), the AR film and the AF film are coated. In Specific, the silicon nitride film is coated on the DLC film in the same way as in the step (4), where the first target material for the diamond-like carbon film is replaced with the second target material for the anti-reflection film. After 5 min from completion of coating, the anti-reflection film is stabilized under cooling. Finally, the glass substrate coated with the DLC film and the AR film was removed from the vacuum chamber and the AF film was coated on the AR film with the third target material by a spraying apparatus.

In embodiments of the disclosure, the AR film as a transition layer may be coated directly with silicon nitride which is the optimal second target material or alternatively single-crystal silicon as the second target material. In an embodiment of the disclosure, single-crystal silicon together with a nitrogen gas that is ventilated into the vacuum chamber is excited under the plasma grating to produce high-temperature and high-pressure plasma and react to form the silicon nitride film.

Figure 2:
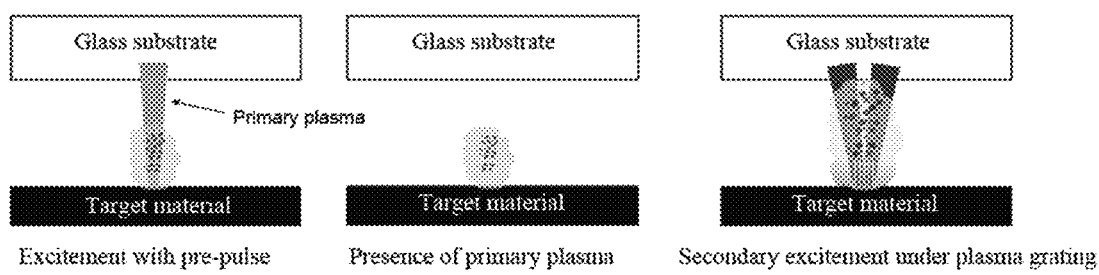
FIG. 2 is a schematic diagram showing the principle of a processing method for ultrafast laser deposition of a multilayer film including a diamond-like carbon film, an anti-reflection film and an anti-fingerprint film on a glass substrate in an embodiment of the disclosure.

It is necessary to produce the primary plasma in advance to assist in forming the plasma grating in the vacuum chamber, because it is difficult to form the plasma grating due to plasma defocusing caused by lack of air. FIG. 2 is a schematic diagram showing coating a film by excitement under plasma grating on a target material in an embodiment of the disclosure, where the target material is firstly excited by a pulsed laser beam (such as a picosecond pulsed laser beam or a femtosecond pulsed laser beam) as a pre-pulse to produce primary plasma, in which a large number of under-excited clusters and a small number of atoms and ions at the high energy level are present, less contributing to forming the film. After the excitement with the picosecond pulsed laser beam as the pre-pulse, the primary plasma persists for a certain time interval, during which two femtosecond pulsed laser beams as the post-pulses are directed through the glass substrate into the primary plasma, where the femtosecond pulsed laser beams under the equilibrium between the Kerr self-focusing effect and the plasma defocusing effect form femtosecond filaments and intersect at a small included angle near a focal point. The two femtosecond pulsed laser beams are arranged for their respective travelled optical paths for achieving time domains synchronization, before interact with each other in the intersecting region to form femtosecond plasma grating for the secondary excitement on the target material, so that the clusters in the primary plasma and the target material are fully excited to form more plasma. The resulting plasma propagates vertically towards the glass substrate, on the surface of which a local film is formed under cooling. Next, the target material is moved relative to the glass substrate, thus coating the film with a spreading area on the glass substrate. All of the pulsed laser beams pass through the glass substrate before exciting the target material, which allows the pre-treatment on the glass substrate to activate its surface structure, contributing to deposition of the plasma.

Figure 3:
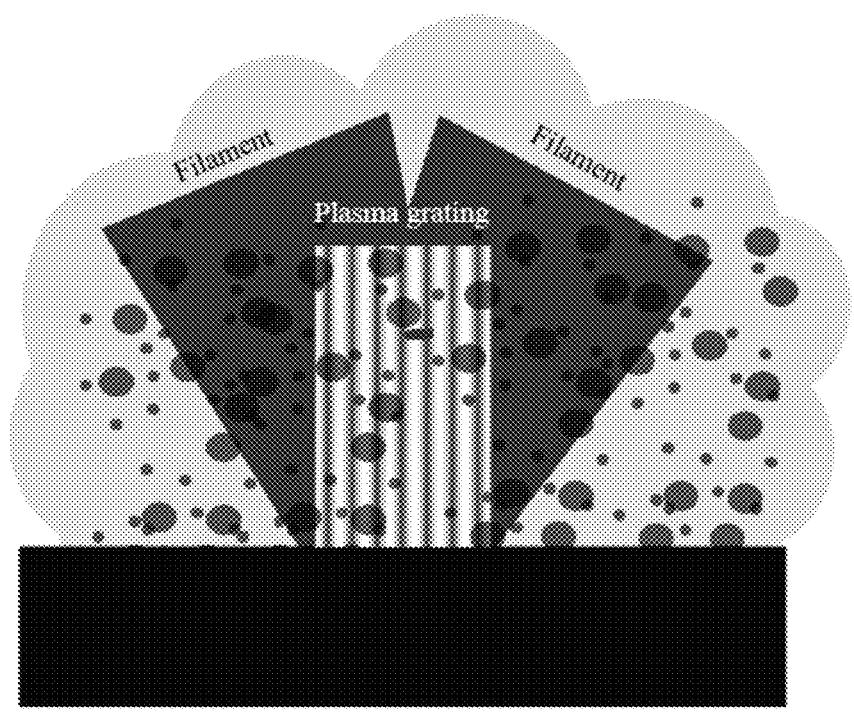
FIG. 3 is a schematic diagram showing the principle of forming plasma grating in an embodiment of the disclosure.

FIG. 3 is a schematic diagram showing the principle of forming the plasma grating in an embodiment of the disclosure, where the femtosecond pulsed laser beams as the post-pulses during propagating in the primary plasma form the stable femtosecond filaments under the equilibrium between the Kerr self-focusing effect and the plasma defocusing effect; while due to the interference in the intersecting region, the femtosecond pulsed laser beams further form a periodic distribution with alternate light and dark, which is related to the included angle (θ) between the two filaments. The remarkable enhanced light intensity in the intersecting region after interaction results in a higher order of a non-linear effect, which needs more plasma for defocusing to achieve the equilibrium, such that the optical power density and the electron density are increased within the plasma grating. Accordingly, the target material is excited by both the electron collision and the multi-photon, with obviously improved effect by the secondary excitement presented.

Figure 4:
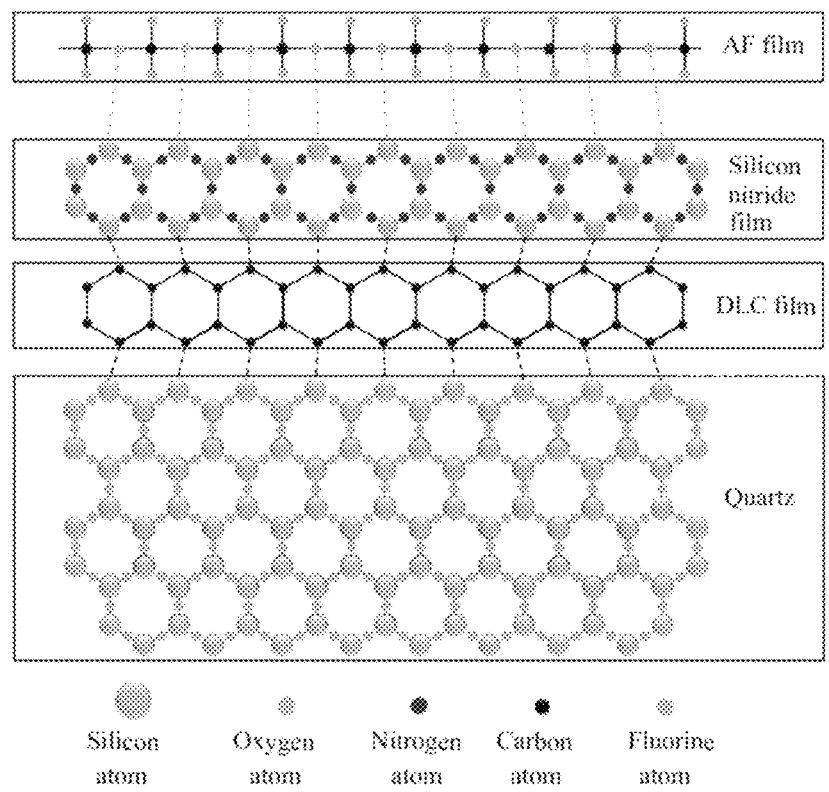
FIG. 4 is a schematic diagram showing a structure of a multilayer film in an embodiment of the disclosure.

FIG. 4 is a schematic diagram showing a structure of a multilayer film in an embodiment of the disclosure, where the glass substrate is directly coated with a DLC film with carbon atoms well aligned; an AR film composed of silicon nitride as a transition layer is coated on the DLC film; and an AF film composed of perfluoropolyether is coated on the AR film. The silicon atoms in the AR film as the transition layer form Si—C and Si—O bonds with the C atoms in the DLC film and the O atoms in the perfluoropolyether, respectively, thus allowing increased adhesion between the DLC film and the AF film by the AR film.

Figure 5:
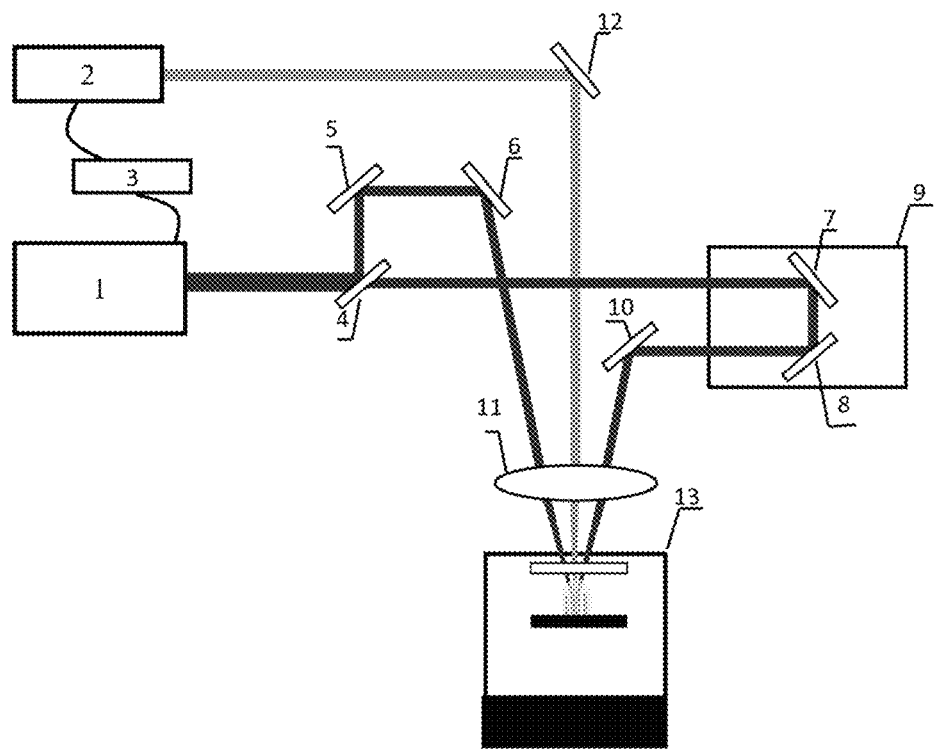
FIG. 5 is a schematic diagram showing a processing apparatus for coating a multiple film in an embodiment of the disclosure.

In embodiments of the disclosure, the processing method for ultrafast laser deposition of a multilayer film is performed by the processing apparatus. FIG. 5 is a schematic diagram showing a processing apparatus for coating a multiple film in an embodiment of the disclosure. As shown in FIG. 5, the processing apparatus includes: the femtosecond pulsed laser beam generator 1, the picosecond pulsed laser beam generator 2, the digital time delay generator 3, the beam splitter 4, the high reflection mirror A 5, the high reflection mirror B 6, the high reflection mirror C 7, the high reflection mirror D 8, the stepping motor 9, the high reflection mirror E 10, the focusing lens 11, the high reflection mirror F 12, and the loading platform 13. In use of the processing apparatus, the picosecond pulsed laser beam generator 2 generates a picosecond pulsed laser beam to excite the target material once focused to produce primary plasma; after a time interval, the femtosecond pulsed laser beam generator 1 generates a femtosecond pulsed laser beam which is then subjected to beam-splitting to form multiple femtosecond pulse laser sub-beams before synchronization for time domain to focus, such that the plasma grating is formed in the primary plasma. The digital time delay generator 3 is responsible for setting the time interval, typically within 100 fs to 100 ns, between the excitement with the pre-pulse and the secondary excitement with the post-pulses. The two femtosecond pulse laser sub-beams are synchronized for time domain by the stepping motor 9, allowing a first optical path passing through the high reflection mirror A 5 and the high reflection mirror B 6 to be consistent with a second optical path passing through the high reflection mirror C 7, the high reflection mirror D 8 and the high reflection mirror E 10, such that the two femtosecond pulse laser sub-beams reach around the focal point simultaneously and intersect with each other for interaction in the primary plasma to form the plasma grating for the secondary excitation on the target material at the loading platform 13.

EXAMPLE 1

The glass substrate was washed respectively in acetone (or alcohol) and deionized water under sonication for 50 min, and dried at a temperature of 60° C. for 1 h in a drying oven. At the loading platform in the vacuum chamber, carbon as the first target material and silicon nitride as the second target material, were fixed away from the glass substrate at a distance of 3 cm, with vacuuming achieved to 10 mBar prior to distance arranging. The total laser energy of the femtosecond pulsed laser beams was set to be 2 mJ, where a single light filament was of an energy of 1 mJ. The two filaments intersect at the included angle of 7° for interaction with each other to form the plasma grating. Before the excitation with the pulsed laser beam, the glass substrate fixed at the position A of the loading platform was arranged to move relative to the first target material fixed at the position B of the loading platform at a speed of 30 mm/s, resulting in an interval distance of 30 μm between individual spots deposited after the excitation with the pulsed laser beams. The excitation was arranged to start after the loading platform started moving, and to stop before the movement of the loading platform stopped. The time period of deposition was set as 5 min, for completion of depositing on the glass substrate to form the DLC film. Next, the AR film was coated on the DLC film with the silicon nitride as the second target material, where the second target material fixed at the position C of the loading platform in the vacuum chamber was arranged at a distance 5 cm away from the glass substrate, with other conditions same as those for coating the DLC film. Finally, the pressure in the vacuum chamber was restored before the glass substrate coated with the DLC film and the AR film was removed out of the vacuum chamber for coating the AF film with perfluoropolyether as the third target material by the spraying apparatus.

Example 2

The glass substrate was washed respectively in acetone (or alcohol) and deionized water under sonication for 50 min, and dried at a temperature of 60° C. for 1 h in a drying oven. At the loading platform in the vacuum chamber, carbon as the first target material and silicon nitride as the second target material, were fixed away from the glass substrate at a distance of 4 cm, with vacuuming achieved to 10 mBar prior to distance arranging. The total laser energy of the femtosecond pulse laser sub-beams was set to be 2 mJ, where a single light filament was of an energy of 1 mJ. The two filaments intersect at the included angle of 7° to form the plasma grating. Before the excitation with the pulsed laser beam, the glass substrate fixed at the position A of the loading platform was arranged to move relative to the first target material fixed at the position B of the loading platform at a speed of 30 mm/s, resulting in an interval distance of 30 μm between individual spots deposited after the excitation with the pulsed laser beams. The excitation was arranged to start after the loading platform started moving, and to stop before the movement of the loading platform stopped. The time period of deposition was set as 5 min, for completion of depositing on the glass substrate to form the DLC film. Next, the AR film was coated on the DLC film with the silicon nitride as the second target material, where the second target material fixed at the position C of the loading platform in the vacuum chamber was arranged at a distance 6 cm away from the glass substrate, with other conditions same as those for coating the DLC film. Finally, the pressure in the vacuum chamber was restored before the glass substrate coated with the DLC film and the AR film was removed out of the vacuum chamber for coating the AF film with perfluoropolyether as the third target material by the spraying apparatus, where the third target material was arranged at a distance 4 cm away from the glass substrate coated with the DLC film and the AR film.

Testing Example 1

In order to exhibit the diamond-like effect, it is necessary for the carbon atom in the DLC film to be arranged in an orthotetrahedral configuration, which is formed by sp3 hybridization of the carbon atom to form a spatially stereo-specific orbital structure, and thus requiring a higher energy compared to that of sp2 hybridization with a planar structure.

Figure 6:
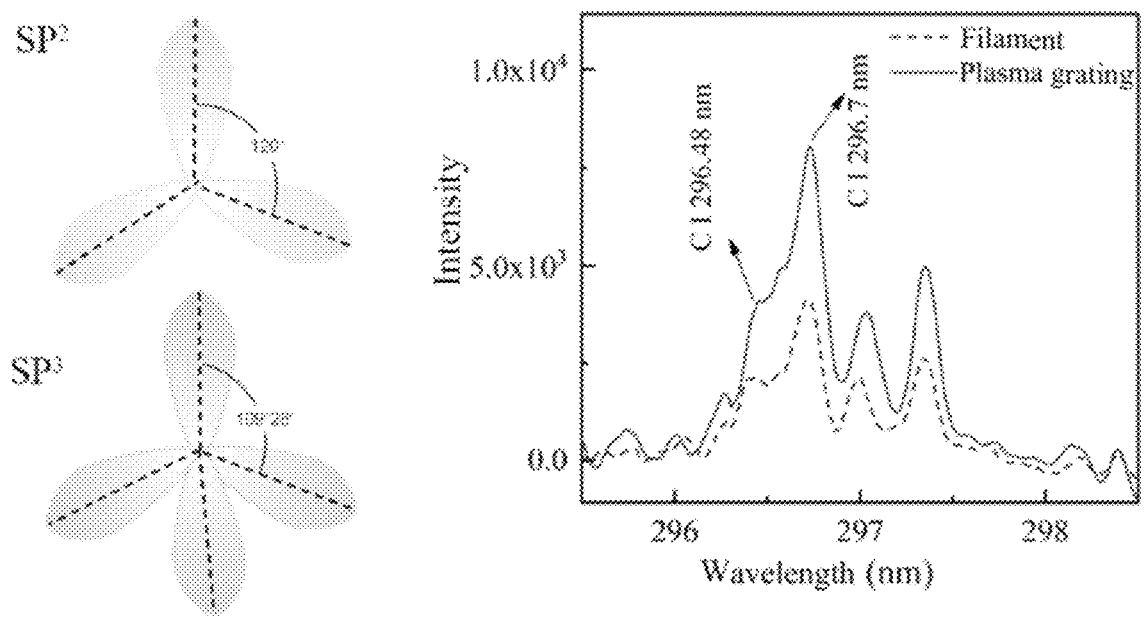
FIG. 6 is a testing result of plasma grating formed under secondary excitement on a first target in an embodiment of the disclosure.

In order to demonstrate that the excitation under the plasma grating in embodiments of the disclosure effectively improves the film-forming effect of the DLC film, the plasma grating produced under the secondary excitation was tested in a spectral way, and the obtained spectrum is shown in FIG. 6 (corresponding to the excitation conditions described in Example 1), where both peaks at respective wavelengths of C I 296.4 nm and C I 296.7 nm for the solid line correspond to energy level transition from sp2 to the sp3 by the excitation under the plasma grating, and the dashed line represented a spectral line under excitation by the conventional filaments. From FIG. 6, it can be seen that the intensity of the spectral line formed by the excitation under the plasma grating is much higher than that of the excitation by the conventional filaments, indicating that the excitation under the plasma grating increases the number of the sp3 hybridized carbon atoms, thus contributing to better formation of the DLC film.

The above described are only embodiments of the disclosure, and common knowledge of specific technical solutions and/or features known in the technical solutions are not overly described here. It should be noted that for a person skilled in the art, several deformations and improvements can be made without departing from the technical solutions of the disclosure, and these should also be regarded as the scope of protection of the disclosure, which will not affect the effect of the implementation of the disclosure and the practicality of the disclosure. The scope of protection claimed in the disclosure shall be subject to the content of its claims, and the specific implementation and other records in the specification can be used to interpret the content of the claims.

What is claimed is:
1. A processing method for ultrafast laser deposition of a multilayer film comprising a diamond-like carbon film, an anti-reflection film and an anti-fingerprint film, wherein the processing method is performed by a processing apparatus comprising a laser emitting unit, a delay unit, a beam-splitting unit, a reflection unit, and a loading platform, the processing method comprises the following steps:
  Step 1: providing a glass substrate;
  Step 2: providing carbon as a first target material for the diamond-like carbon film, silicon nitride or single-crystal silicon as a second target material for the anti- reflection film, and perfluoropolyether as a third target material for the anti-fingerprint film;

Step 3: arranging, at the loading platform in a vacuum chamber, the first target material and the second target material away from the glass substrate at a distance of 2 to 5 cm before vacuuming;

Step 4: coating the diamond-like carbon film, comprising:
generating by a laser emitting unit a plurality of pulsed laser beams,
one of which as a pre-pulse excites the first target material to produce primary plasma, and remainders of which are beam-split as post-pulses by the beam-splitting unit and time domain-synchronized by a delay unit to intersect for interaction to form plasma grating in the primary plasma for secondary excitement on the first target material, thereby producing and depositing graphite plasma on the glass substrate, and
moving the first target material relative to the glass substrate, thereby forming the diamond-like carbon film with a spreading area; and Step 5: coating the anti-reflection film and the anti-fingerprint film, comprising:
repeating the Step 4 with the first target material replaced by the second target material, to coat the anti-reflection film on the diamond-like carbon film, and
coating the anti-fingerprint film with the third target material by a spraying apparatus.

2. The processing method according to claim 1, wherein in the Step 1, providing a glass substrate further comprises: washing the glass substrate respectively with an organic solvent and deionized water under sonication for 30 to 50 min; and
drying at a temperature of 60 to 80° C. for 1 h.

3. The processing method according to claim 2, wherein in the Step 3, the vacuum chamber is provided with a pressure less than or equal to 10 mBar by the vacuuming.

4. The processing method according to claim 3, wherein in the Step 4,
a total laser energy is greater than or equal to 2 mJ; and
a single femtosecond pulsed laser beam after the beam-splitting is of an energy greater than 0.5 mJ, a repetition frequency of 1 kHz to 1 MHz, a pulse width of 10 to 500 fs, and a central wavelength of 200 to 400 nm in an ultraviolet band, 400 to 700 nm in a visible band, or 700 to 2500 nm in an infrared band.

5. The processing method according to claim 4, wherein in the Step 4,
excitement with the pre-pulse is 100 fs to 100 ns before the secondary excitement with the post-pulses;
the pre-pulse is a picosecond pulsed laser beam broadened from a femtosecond pulsed laser beam or generated by a picosecond pulsed laser beam generator; and
the post-pulses forms an included angle of 5 to 10°.

6. The processing method according to claim 5, wherein in the Step 4, the first target material is moved relative to the glass substrate at a speed of 10 to 50 mm/s.

7. The processing method according to claim 6, wherein the second target material for the anti-reflection film is silicon nitride.

* * * * *